United States Patent [19]

Ito et al.

[11] Patent Number: 5,858,579
[45] Date of Patent: Jan. 12, 1999

[54] MASKING FILMS CONTAINING LIGHT SHIELDING PEELABLE LAYER UTILIZING NITRILE RESINS

[75] Inventors: Hidekazu Ito, Urawa; Masahiro Harada, Ageo, both of Japan

[73] Assignee: Kimoto Co., Ltd., Japan

[21] Appl. No.: 729,156

[22] Filed: Oct. 11, 1996

[30] Foreign Application Priority Data

Mar. 1, 1996 [JP] Japan ................................. 8-071059

[51] Int. Cl.$^6$ ............................. G03F 9/00; B32B 27/00
[52] U.S. Cl. .......................... 430/5; 428/412; 428/473.5; 428/476.3; 428/483; 428/500; 428/522
[58] Field of Search ................................. 430/5; 428/412, 428/476.3, 473.5, 483, 500, 522

[56] References Cited

U.S. PATENT DOCUMENTS

| | | | |
|---|---|---|---|
| 4,923,727 | 5/1990 | Maruyama et al. | 428/40 |
| 5,043,198 | 8/1991 | Maruyama et al. | 428/40 |

FOREIGN PATENT DOCUMENTS 1207753   8/1989   Japan .

Primary Examiner—Christopher G. Young
Attorney, Agent, or Firm—Lorusso & Loud

[57] ABSTRACT

A masking film comprises a light-shielding peelable layer which is provided on a transparent support and comprises a polymer binder comprising a vinyl chloride resin, a rubber-like resin and a thermoplastic resin having OH groups and being compatible with the rubberlike resin and the vinyl chloride resin, wherein the polymer binder comprises a mixed nitrile rubber of a nitrile rubber having an acrylonitrile content of about 33% by weight and a Mooney viscosity of about 50 to 90 and another nitrile rubber either having an acrylonitrile content of about 28 to 32% by weight and a Mooney viscosity of about 35 to 70 or having an acrylonitrile content of about 33% by weight and a Mooney viscosity of about 35 to 50. The masking film simultaneously exhibits appropriate flexibility, good pick-up property, peelability and anti-blocking property of the light-shielding peelable layer and is stable against degradation of these properties with time.

12 Claims, No Drawings

MASKING FILMS CONTAINING LIGHT SHIELDING PEELABLE LAYER UTILIZING NITRILE RESINS

BACKGROUND OF THE INVENTION

The present invention relates to a masking film mainly used in a photo-mechanical process or the like, wherein desired patterns are cut out from a light-shielding peelable layer of the film and unwanted portions are peeled off to form transparent images of the desired patterns.

As masking films used in the photo-mechanical process and the like, those having a light-shielding peelable layer provided on a transparent support are widely known. Such a light-shielding peelable layer requires various properties. Specifically, it should have good physical properties as a coated layer, good pick-up property (i.e., its edges should be easy to pick up from the transparent support), good peelability and anti-blocking property, and high stability of these properties with time.

A known masking film attempting to satisfy these requirements comprises a binder component of the light-shielding peelable layer consisting of a vinyl chloride resin such as vinyl chloride/vinyl acetate copolymers and vinyl chloride/vinyl acetate/maleic acid copolymers and a nitrile rubber having an acrylonitrile content of 19 to 51% by weight and a Mooney viscosity of 50 to 90.

However, this masking film does not provide all of the required properties. Further, it was found that, regardless of how the properties of the resin and the rubber were changed and/or how the weight ratio of the resin and the rubber was strictly controlled in such a masking film, the various required properties could not be obtained simultaneously. In other words, the above required properties cannot simultaneously obtained by using only one kind of the rubber with a vinyl chloride resin.

Under these circumstances, there has also been proposed a masking film comprising a binder component consisting of a vinyl chloride resin and a mixed nitrile rubber comprising one nitrile rubber having an acrylonitrile content of about 27% by weight and another nitrile rubber having an acrylonitrile content of about 33% by weight in a mixing ratio of 2:1 to 1:1 by weight (Japanese Patent Unexamined Publication [KOKAI] No. 1-207753).

The use of the nitrile rubber having an acrylonitrile content of about 27% by weight in addition to one having a content of about 33% by weight does in fact increase adhesion of the light-shielding peelable layer. However, these nitrile rubbers in the mixing ratio mentioned above are likely to unduly increase the adhesion and hence markedly degrade the pick-up property and peelability of the light-shielding peelable layer. On the other hand, if the amount of the nitrile rubbers contained in the binder relative to the resin is decreased to reduce the adhesion of the peelable layer, the properties of the coated layers are likely to degrade with time.

Therefore, the object of the present invention is to provide masking films which can simultaneously satisfy the above-mentioned requirements, which have not been simultaneously satisfied by any conventional masking film, namely, appropriate flexibility, good pick-up property, peelability and anti-blocking property of the light-shielding peelable layer, and stability against degradation of these properties with time.

SUMMARY OF THE INVENTION

It was found that the above object can be achieved by the masking film of the invention described below.

The present invention provides a masking film comprising a light-shielding peelable layer which is provided on a transparent support and comprises a polymer binder comprising a vinyl chloride resin, a rubberlike resin and a thermoplastic resin having OH (hydroxyl) groups and being compatible with the rubberlike resin and the vinyl chloride resin, wherein the rubberlike resin comprises a mixed nitrile rubber of one nitrile rubber having an acrylonitrile content of about 33% by weight and a Mooney viscosity of about 50 to 90 and another nitrile rubber either having an acrylonitrile content of about 28 to 32% by weight and a Mooney viscosity of about 35 to 70 or having an acrylonitrile content of about 33% by weight and a Mooney viscosity of about 35 to 50.

In a preferred embodiment of the masking film of the present invention, the mixing ratio by weight of the nitrile rubber having an acrylonitrile content of about 33% by weight and a Mooney viscosity of about 50 to 90 and the other nitrile rubber either having an acrylonitrile content of about 28 to 32% by weight and a Mooney viscosity of about 35 to 70 or having an acrylonitrile content of about 33% by weight and a Mooney viscosity of about 35 to 50 is 19:1 to 1:1.

Further, the Mooney viscosities of the two kinds of nitrile rubber contained in the mixed nitrile rubber are preferably different from each other by 4 or more, more preferably 15 or more.

The weight ratio of the vinyl chloride resin and the thermoplastic resin having OH groups is preferably in the range of 8:2 to 2:8. Further, it is desirable that the polymer binder of the light-shielding peelable layer comprises 20 to 40% by weight of the mixed nitrile rubber.

PREFERRED EMBODIMENTS OF THE INVENTION

The transparent support of the masking film according to the present invention is provided to support the light-shielding peelable layer and must show transparency suitable for the intended use of the masking film of the present invention. The term "transparency" herein used means that the support has transparency with respect to visible light to an extent that, when the masking film is placed on an original, one can readily recognize the original through the film.

The transparent support maybe a plastic film composed of polyesters, polycarbonates, triacetylcelluloses, polyvinyl chlorides, acrylic resins, polystyrenes, polyamides, polyimides, polyethylenes, polypropylenes or the like. Biaxially oriented polyester films are preferred from the point of transparency. Films having a thickness of 25 to 250 μm are suitable. The surface of the transparent support opposite to the surface to be provided with the light-shielding peelable layer may optionally be subjected to a matting treatment by, for example, sand blasting or chemical matting to an extent not degrading the transparency in order to improve vacuum contact of the film in the photo-mechanical process and anti-blocking property.

The light-shielding peelable layer comprises at least a polymer binder comprising a vinyl chloride resin, a rubberlike resin and a thermoplastic resin having OH groups compatible with the vinyl chloride resin and the rubberlike resin, and a light-shielding material for shielding active light. The light-shielding peelable layer is provided on the transparent support described above.

The vinyl chloride resin should be compatible with the rubberlike resin and stable at room temperature, i.e., not sticky at room temperature. The term "vinyl chloride resin" herein means a polymer containing units derived from vinyl chloride monomers. Examples of the vinyl chloride resin are vinyl chloride/vinyl acetate copolymers, vinyl chloride/acrylic acid copolymers, vinyl chloride/acrylic ester copolymers, vinyl chloride/vinylidene chloride copolymers, vinyl chloride/vinyl acetate/maleic acid copolymers, chlorinated vinyl chloride resins and the like. These vinyl chloride resin may be used alone or in any combination of two or more as circumstances may require.

The vinyl chloride resin generally has a molecular weight of from 2,000 to 200,000, preferably from 4,000 to 100,000.

The rubberlike resin is adhesive to the transparent support and functions to impart flexibility to the light-shielding layer. As the rubberlike resin, nitrile rubbers, acryl rubbers, urethane rubbers, butadiene rubbers, isoprene rubbers, styrene/butadiene rubbers, carboxyl group-containing nitrile rubbers, butyl rubbers, ethylene/vinyl acetate rubbers, ethylene/acrylate rubbers, chlorinated polyethylenes, chlorosulfonated polyethylenes, other various thermoplastic elastomers and the like are used. Among these, nitrile rubbers, i.e., acrylonitrile/butadiene rubbers, are particularly preferably used for the rubberlike resin from the point of adhesion and compatibility with the other components. The nitrile rubber herein used includes ternary copolymers of acrylonitrile, butadiene and a monomer having a carboxylate group.

Studies conducted by the present inventors showed that a light-shielding peelable layer for masking film showing appropriate flexibility while having relatively strong adhesion to the support, i.e., a light-shielding peelable layer showing improved flexibility, pick-up property and adhesion and stability against change of these properties with time can be obtained by using a nitrile rubber having an acrylonitrile content of about 33% by weight and a Mooney viscosity of about 50 to 90 (hereinafter referred to as "nitrile rubber A") and another nitrile rubber having an acrylonitrile content of about 28 to 32% by weight and a Mooney viscosity of about 35 to 70 (hereinafter referred to as "nitrile rubber B") as the rubberlike resin.

Further, it was also found that the advantages described above can be obtained also by using the nitrile rubber A with another nitrile rubber having an acrylonitrile content of about 33% by weight and a Mooney viscosity of about 35 to 50 (hereinafter referred to as "nitrile rubber C").

The Mooney viscosity referred to herein is a value measured at $ML_{1+4}$ 100° C.

The term "acrylonitrile content" herein used means a weight percentage of the units contained in the nitrile rubber and derived from acrylonitrile relative to the total weight of the nitrile rubber.

The mixing ratio by weight of the nitrile rubber A and the nitrile rubber B or C is preferably 19:1 to 1:1, more preferably 4:1 to 1:1. If the amount of the nitrile rubber B or C is below this range, the coated layer becomes unduly hard and hence appropriate flexibility and adhesion of the coated layer cannot be obtained. This may result in the coated layer peeling too easily and spontaneous peeling of remaining coated layer with time. On the other hand, if the amount of the nitrile rubber B or C exceeds this range, the coated layer becomes unduly soft and the coated layer therefore becomes too flexible and too adhesive.

Further, the Mooney viscosities of the nitrile rubber A and the nitrile rubber B or C are preferably different by 4 or more, more preferably by 15 or more.

In general, a nitrile rubber shows maximum adhesion at an acrylonitrile content of about 25% by weight and adhesion decreases as the acrylonitrile content deviates from 25% by weight. Flexibility improves as the acrylonitrile content decreases and conversely the coated layer becomes harder as the content increases. On the other hand, adhesion increases as the Mooney viscosity increases, and flexibility of the coated layer improves as the Mooney viscosity decreases. Based on these relations, the present inventors repeatedly selected combinations of the acrylonitrile content and the Mooney viscosity of the two kinds of nitrile rubbers contained in the rubberlike resin in order to obtain a good balance of the properties mentioned above. Through this process of trial and error they finally reached the above findings.

The polymer binder preferably comprises 20 to 40% by weight of the mixed nitrile rubber in order to satisfy the property requirements of the light-shielding layer. A nitrile rubber content of 20% by weight or more imparts the light-shielding layer with appropriate adhesion to the support and flexibility. On the other hand, a nitrile rubber content of 40% by weight or less prevents excessive adhesion and flexibility and hence prevents elongation of the light-shielding layer upon peeling. Further, appropriate pick-up property can also be obtained by a nitrile rubber content with in the above range.

The rubberlike resin generally has a molecular weight of from 5,000 to 2,000,000, preferably from 10,000 to 1,500,000.

By controlling the mixing ratio of the vinyl chloride resin and the rubberlike resin, adhesion to the support, flexibility, pick-up property and the like of the light-shielding layer can be controlled. However, not all of the required properties mentioned above, i.e., adhesion to the transparent support, flexibility, pick-up property, anti-blocking property and the like, can be optimized only by controlling the content of these two components. Specifically, increasing the content of the rubberlike resin to preponderantly improve adhesion to the transparent support, flexibility and pick-up property has the effect of lowering the glass transition point of the light-shielding layer and this degrades the anti-blocking property under high temperature circumstances.

Therefore, according to the present invention, an appropriate amount of thermoplastic resin having OH groups is added in addition to the vinyl chloride resin and the rubberlike resin to improve anti-blocking property. This finally makes it possible to obtain masking films simultaneously satisfying all of the required properties, i.e., appropriate pick-up property, adhesion, flexibility, anti-blocking property and the like.

Examples of the thermoplastic resin having OH groups are phenoxy resins, epoxy resins, acrylic resins, polyvinyl acetal resins, vinyl chloride/acrylic acid ester copolymers, vinyl chloride/vinyl acetate/vinyl alcohol copolymers, styrene/maleic acid half esters, cellulose resins and the like.

Among these, vinyl chloride/vinyl acetate/vinyl alcohol copolymers are particularly preferred. These copolymers preferably contain about 15% by weight or less in a molar ratio of the units derived from monomers having OH groups relative to the total units, because those having a content of more than 15% by weight impart excessive adhesion.

The thermoplastic resin containing OH groups generally has a molecular weight of from 2,000 to 200,000, preferably from 4,000 to 100,000.

According to the present invention, good balance of adhesion and anti-blocking property can be obtained by selecting a mixing ratio by weight of the vinyl chloride resin and the thermoplastic resin having OH groups within a range of 8:2 to 2:8, preferably 7:3 to 3:7. When the amount of the thermoplastic resin having OH groups exceeds 8 parts by weight with respect to 2 parts by weight of the vinyl chloride resin, satisfactory anti-blocking property cannot be obtained, although adhesion is enhanced. On the other hand, when the amount of the former is less than 2 parts by weight with respect to 8 parts by weight of the latter, adhesion is degraded and optimum properties cannot be obtained, although the glass transition point is increased and hence anti-blocking property is improved.

According to the present invention, the properties required for masking films, but not simultaneously achievable by any conventional masking film, are achieved by using the three kinds of components described above as the binder of the light-shielding peelable layer and using a specific mixed nitrile rubber as the rubberlike resin. That is, the masking film of the present invention shows optimum adhesion to the support of the light-shielding peelable layer and flexibility of the layer and markedly improved anti-blocking property and, simultaneously, shows improved stability against degradation of physical properties of the light-shielding layer with time.

The light-shielding material contained in the light-shielding layer of the masking film of the present invention prevents transmission of light having a wavelength of from 300 to 550 nm and can be suitably selected from among known dyes and pigments.

In addition to the components explained hereinbefore, the light-shielding peelable layer may optionally contain other additives such as organic and inorganic matting agents, levelling agents, anti-static agents and moisture controlling agents, so long as they do not adversely affect the desired properties of the masking film of the present invention.

The light-shielding peelable layer generally has a thickness of from 10 to 50 μm, preferably from 15 to 45 μm.

The light-shielding masking film of the present invention can be produced by preparing a coating solution comprising the resin components described above, a light-shielding material and optional additives dissolved or dispersed in a solvent such as a ketone or aromatic solvent and coating a transparent support with the solution by a conventional coating method such as kiss-roll coating, reverse coating, bar coating, knife coating, gravure coating or microgravure coating.

The masking films of the present invention comprising a light-shielding peelable layer having the composition described above show appropriate flexibility, improved anti-blocking property, adhesion to support, pick-up property and the light-shielding property, as well as improved stability against change of the foregoing properties of the light-shielding layer with time.

EXAMPLES

The present invention will be further explained with reference to the following non-limitative examples.

Examples 1 to 9 and Comparative Examples 1 to 6

Coating solutions for light-shielding peelable layer having the compositions shown in Table 1 were each applied to a polyester film having a thickness of 100 μm by a Mayer bar, dried for 6 minutes at 120° C. to give masking films having a light-shielding peelable layer thickness of 23 μm (Examples 1 to 9 and Comparative Examples 1 to 6).

In Table 1, Resin A is a vinyl chloride/vinyl acetate copolymer (VINYLITE VYHH, Union Carbide Co., Ltd.), Resin B is a vinyl chloride/vinyl acetate/vinyl alcohol copolymer (DENKA VINYL #1000 GSK, Denki Kagaku Kogyo K.K.), silica is OK-412 (Nippon Aerosil Co., Ltd.) and additive is a silicone levelling agent (PAINTAD-M, Dow Corning Inc.). Rubbers A1 to A4, B1 to B5, C1, D1 and D2 are the following commercially available acrylonitrile rubbers.

Rubber A1: Nipol-1042, Nippon Zeon Co., Ltd.
Rubber A2: Nipol-DN3350, Zeon Chemicals Inc.
Rubber A3: Hycar-1432, Zeon Chemicals Inc.
Rubber A4: Paracril BJLT-M50, Uniroyal Co., Ltd.
Rubber B1: Nipol-DN300, Nippon Zeon Co., Ltd.
Rubber B2: Nipol-DN2835, Zeon Chemicals Inc.
Rubber B3: Nipol-1453HM, Zeon Chemicals Inc.
Rubber B4: Nipol-DN223, Nippon Zeon Co., Ltd.
Rubber B5: Nipol-DN202, Nippon Zeon Co., Ltd.
Rubber C1: Nipol-DN211, Nippon Zeon Co., Ltd.
Rubber D1: Nipol-DN401, Nippon Zeon Co., Ltd.
Rubber D2: Nipol-DN1041, Nippon Zeon Co., Ltd.

Rubbers A1 to A4, B1 to B5, C1, D1 and D2 have the following acrylonitrile contents and Mooney viscosities.

|  | Acrylonitrile content (wt %) | Mooney viscosity |
| --- | --- | --- |
| Rubber A1 | about 33 | 78 |
| Rubber A2 | about 33 | 50 |
| Rubber A3 | about 33 | 90 |
| Rubber A4 | about 33 | 50 |
| Rubber B1 | about 28 | 45 |
| Rubber B2 | about 28 | 35 |
| Rubber B3 | about 29 | 68 |
| Rubber B4 | about 32 | 35 |
| Rubber B5 | about 31 | 63 |
| Rubber C1 | about 33 | 46 |
| Rubber D1 | about 18 | 78 |
| Rubber D2 | about 41 | 83 |

TABLE 1

| | Example | | | | | | | | |
| --- | --- | --- | --- | --- | --- | --- | --- | --- | --- |
| | 1 | 2 | 3 | 4 | 5 | 6 | 7 | 8 | 9 |
| Resin A | 3.5 | 2.8 | 5.6 | 2.8 | 2.8 | 3.5 | 3.5 | 5.6 | 5.6 |
| Resin B | 3.5 | 4.2 | 1.4 | 4.2 | 4.2 | 3.5 | 3.5 | 1.4 | 1.4 |
| Rubber A1 | 2.4 | 2.1 | 1.5 | | | | | | |
| Rubber A2 | | | | 2.4 | | | | | |
| Rubber A3 | | | | | 2.7 | 2.1 | | | 1.5 |
| Rubber A4 | | | | | | | | 1.5 | |
| Rubber B1 | 0.6 | 0.9 | | | | | | | |
| Rubber B2 | | | | 0.6 | | | | | |
| Rubber B3 | | | | | 0.3 | | | | |
| Rubber B4 | | | | | | 0.9 | | | |
| Rubber B5 | | | | | | | 1.2 | | |
| Rubber C1 | | | 1.5 | | | | 1.8 | 1.5 | 1.5 |
| Orange dye | | | | | 1.0 | | | | |
| Silica | | | | | 0.2 | | | | |
| Additive | | | | | 0.2 | | | | |
| MEK* | | | | | 41.0 | | | | |
| Toluene | | | | | 41.0 | | | | |

| | Comparative Example | | | | | |
| --- | --- | --- | --- | --- | --- | --- |
| | 1 | 2 | 3 | 4 | 5 | 6 |
| Resin A | 7.0 | 5.6 | | 2.1 | 2.8 | 4.2 |
| Resin B | | 1.4 | 7.0 | 4.9 | 4.2 | 2.8 |
| Rubber A1 | | | | 3.0 | 2.1 | |
| Rubber B1 | 3.0 | 3.0 | | | | 0.6 |
| Rubber C1 | | | 3.0 | | | |
| Rubber D1 | | | | | 0.9 | |
| Rubber D2 | | | | | | 2.4 |

TABLE 1-continued

| | |
|---|---|
| Orange dye | 1.0 |
| Silica | 0.2 |
| Additive | 0.2 |
| MEK* | 41.0 |
| Toluene | 41.0 |

*Methyl ethyl ketone

The masking films obtained above were stored in an atmosphere of 65% RH at 20° C. for one week or one year and evaluated with respect to the following properties. Results are shown in Table 2.

(1) Yield value, stress strength, elongation and adhesion of the light-shielding peelable layer Measurements were performed using samples of the masking films measuring 15 mm×100 mm for yield value, stress strength and elongation, and samples measuring 25 mm×20 mm for adhesion.

Yield value and stress strength are expressed in terms of g/15 mm, elongation is expressed in terms of %, and adhesion is expressed in terms of g/25 mm.

(2) Pick-up property of the peelable layer

Pick-up property of the peelable layer was evaluated by cutting a peelable layer along two lines crossing at an angle of 60° and picking up the edge having the angle with a cutter for plate-making to evaluate whether the edge could be easily picked up or not. The results were ranked as follows.

| | |
|---|---|
| Very easy to pick up | 5 |
| Fairly easy to pick up | 4 |
| Edge is smoothly picked up | 3 |
| Slightly difficult to pick up | 2 |
| Difficult to pick up | 1 |

(3) Stability against degradation with time

Stability of the peelable layer against degradation with time was evaluated by measuring various physical properties of the masking films stored for one year at 20° C. in a 65% RH atmosphere. The results were ranked as follows.

| | |
|---|---|
| Physical properties markedly degraded | 1 |
| Physical properties slightly degraded | 2 |
| Physical properties not degraded | 3 |

(4) Anti-blocking property

Anti-blocking property was evaluated with respect to 50 mm×100 mm samples obtained after coating and drying of the peelable layer. 100 samples were stacked and applied with a pressure of 50 g/cm$^2$, blocking was accelerated in a 10% RH, 50° C. atmosphere of for 24 hours and the blocking area was then measured. The results were ranked as follows.

| Blocking area | |
|---|---|
| 10% or more | 1 |
| 5 to <10% | 2 |
| 3 to <5% | 3 |
| 1 to <3% | 4 |
| 0 to 1% | 5 |

TABLE 2

| | Example | | | | | | | | |
|---|---|---|---|---|---|---|---|---|---|
| | 1 | 2 | 3 | 4 | 5 | 6 | 7 | 8 | 9 |
| Yield value | | | | | | | | | |
| 1 week | 900 | 800 | 1000 | 800 | 1000 | 900 | 850 | 1100 | 1150 |
| 1 year | 1200 | 1150 | 1500 | 1000 | 1200 | 1200 | 1100 | 1300 | 1350 |
| Stress strength | | | | | | | | | |
| 1 week | 1200 | 1100 | 1300 | 1400 | 1300 | 1200 | 1350 | 1200 | 1300 |
| 1 year | 1400 | 1300 | 1550 | 1500 | 1450 | 1350 | 1400 | 1400 | 1400 |
| Elongation | | | | | | | | | |
| 1 week | 320 | 350 | 300 | 350 | 400 | 300 | 300 | 300 | 300 |
| 1 year | 280 | 300 | 250 | 300 | 350 | 250 | 280 | 270 | 280 |
| Adhesion | | | | | | | | | |
| 1 week | 400 | 450 | 300 | 350 | 400 | 300 | 350 | 300 | 300 |
| 1 year | 380 | 400 | 280 | 300 | 350 | 280 | 300 | 270 | 250 |
| Pick-up property | | | | | | | | | |
| 1 week | 3 | 3 | 4 | 3 | 3 | 4 | 3 | 4 | 4 |
| 1 year | 3 | 3 | 4 | 3 | 3 | 4 | 3 | 4 | 4 |
| Stability of properties | | | | | | | | | |
| 1 year | 3 | 3 | 3 | 3 | 3 | 3 | 3 | 3 | 3 |
| Anti-blocking property | 5 | 5 | 4 | 4 | 5 | 4 | 4 | 4 | 4 |
| Overall performance | G* | G | G | G | G | G | G | G | G |

*Good

| | Comparative Example | | | | | |
|---|---|---|---|---|---|---|
| | 1 | 2 | 3* | 4 | 5 | 6 |
| Yield value | | | | | | |
| 1 week | 1300 | 1300 | — | 700 | —** | 1500 |
| 1 year | 1600 | 1550 | — | 900 | —** | 1650 |
| Stress strength | | | | | | |
| 1 week | 1100 | 1000 | — | 1200 | 800 | 1200 |
| 1 year | 1300 | 1200 | — | 1400 | 900 | 1300 |
| Elongation | | | | | | |
| 1 week | 250 | 250 | — | 400 | 150 | 230 |
| 1 year | 200 | 200 | — | 380 | 125 | 180 |
| Adhesion | | | | | | |
| 1 week | 150 | 200 | — | 600 | 700 | 130 |
| 1 year | 100 | 150 | — | 500 | 650 | 100 |
| Pick-up property | | | | | | |
| 1 week | 5 | 4 | — | 1 | 1 | 5 |
| 1 year | 5 | 5 | — | 1 | 1 | 5 |
| Stability of properties | | | | | | |
| 1 year | 1 | 2 | — | 3 | 3 | 1 |
| Anti-blocking property | 1 | 4 | 1 | 4 | 3 | 3 |

TABLE 2-continued

| Overall performance | B*** | B | B | B | B | B |

*The light-shielding layer of Comparative Example 3 could not be peeled.
**Yield value of the light-shielding layer of comparative Example 5 could not be measured because it was too soft.
***Bad From the results for yield value, stress strength and elongation shown in Table 2, it can be seen that the light-shielding peelable layers of the masking films of Examples 1 to 9 had excellent flexibility and, from the results for adhesion, it can be seen that they showed appropriate adhesion. Moreover, they showed excellent pick-up property and anti-blocking property. Further, they showed little change of physical properties of the peelable layers after one year storage and hence they are stable against degradation with time.

On the other hand, it is apparent that the flexibility of the peelable layers of the films of Comparative Examples 1 and 2 was insufficient from the results for yield value, stress strength and elongation, and it is also apparent that the peeling property was insufficient from the results for the adhesion. Moreover, these peelable layers were markedly unstable against degradation of physical properties with time. The light-shielding layer of Comparative Example 3 showed excessive adhesion because it contained only a thermoplastic resin having OH groups with a nitrile rubber, and therefore it could not be peeled off from the support. The light-shielding layer of Comparative Example 4 also showed excessive adhesion because it contained only the nitrile rubber A with a vinyl chloride resin and a thermoplastic resin having OH groups. The light-shielding layer of Comparative Example 5 was unduly soft because it contained a nitrile rubber having a lower acrylonitrile content than those of the rubbers used in Examples 1 to 9 (Rubber D1) and thus showed bad pick-up property and excessive adhesion. The light-shielding layer of Comparative Example 6 showed markedly poor flexibility as seen from the results of yield value, stress strength and elongation because it contained a nitrile rubber having a higher acrylonitrile content than those of the rubbers used in Examples 1 to 9 (Rubber D2). Moreover, it showed significantly poor adhesion and was markedly unstable against degradation with time, although its pick-up property was good.

From the results mentioned above, it can be seen that the masking films of the comparative examples could not satisfy all of the required properties mentioned above.

As explained in the foregoing, the masking films of present invention are excellent in the properties required for masking films such as flexibility, peelability and pick-up property of the light-shielding peelable layer, anti-blocking property, stability of these properties with time and the like. Therefore, they can be used without need for concern regarding problems caused by blocking during storage at a high temperature or during transfer in printing machines. Moreover, they do not require interleaving paper for preventing blocking. Since they also show good stability against change of physical properties with time and therefore they are excellent masking films which during storage after production maintain the same cutting property, pick-up property and peeling property without experiencing unwanted removal of fine line portions. In addition, they maintain the same handling properties even after long-term storage.

What is claimed is:

1. A masking film comprising a light-shielding peelable layer which is provided on a transparent support and comprises a polymer binder comprising a vinyl chloride resin, 20–40% by weight of a nitrile resin and a thermoplastic resin having OH groups and being compatible with the nitrile resin and the vinyl chloride resin, wherein the nitrile resin comprises a mixed nitrile rubber of a first nitrile rubber having an acrylonitrile content of about 33% by weight and a Mooney viscosity of about 50 to 90 and a second nitrile rubber which is either (A), a nitrile rubber having an acrylonitrile content of about 28 to 32% by weight and a Mooney viscosity of about 35 to 70 or (B), a nitrile rubber having an acrylonitrile content of about 33% by weight and a Mooney viscosity of about 35 to 50, wherein the weight ratio of the first nitrile rubber to the second nitrile rubber is 19:1 to 1:1, wherein the Mooney viscosity of the first nitrile rubber is at least 10 higher than the Mooney viscosity of the second nitrile rubber and wherein the first and second nitrile rubbers are copolymers of acrylonitrile and butadiene.

2. The masking film of claim 1, wherein the Mooney viscosities of the two kinds of nitrile rubber contained in the mixed nitrile rubber are different from each other by 15 or more.

3. The masking film of claim 1, wherein the weight ratio of the vinyl chloride resin and the thermoplastic resin having OH groups is in the range of 8:2 to 2:8.

4. The masking film of claim 1, wherein the vinyl chloride resin is selected from the group consisting of vinyl chloride/vinyl acetate copolymers, vinyl chloride/acrylic acid copolymers, vinyl chloride/acrylic ester copolymers, vinyl chloride/vinylidene chloride copolymers, vinyl chloride/vinyl acetate/maleic acid copolymers and chlorinated vinyl chloride resins.

5. The masking film of claim 1, wherein the thermoplastic resin containing OH groups is selected from the group consisting of phenoxy resins, epoxy resins, acrylic resins, polyvinyl acetal resins, vinyl chloride/acrylic ester copolymers, vinyl chloride/vinyl acetate/vinyl alcohol copolymers, styrene/maleic acid half esters and cellulose resins.

6. The masking film of claim 1, wherein the light-shielding peelable layer has a thickness of from 10 to 50 μm.

7. The masking film of claim 6, wherein the light-shielding peelable layer has a thickness of from 15 to 45 μm.

8. The masking film of claim 1, wherein the transparent support is a plastic film composed of a material selected from the group consisting of polyesters, polycarbonates, triacetylcelluloses, polyvinyl chlorides, acrylic resins, polystyrenes, polyamides, polyimides, polyethylenes and polypropylenes.

9. The masking film of claim 8, wherein the transparent support is a biaxially oriented polyester film.

10. The masking film of claim 1, wherein the transparent support has a thickness of from 25 to 250 μm.

11. The masking film of claim 1 wherein said second nitrile rubber is nitrile rubber (A).

12. The masking film of claim 1 wherein said second nitrile rubber is nitrile rubber (B).

* * * * *